(12) United States Patent
Domon et al.

(10) Patent No.: US 8,187,449 B2
(45) Date of Patent: May 29, 2012

(54) CLEANING METHOD BY ELECTROLYTIC SULFURIC ACID AND MANUFACTURING METHOD OF SEMICONDUCTOR DEVICE

(75) Inventors: Hiroki Domon, Tamano (JP); Yusuke Ogawa, Tamano (JP); Masaaki Kato, Tamano (JP); Takamichi Kishi, Tamano (JP); Naoya Hayamizu, Minato-ku (JP); Makiko Tange, Minato-ku (JP); Yoshiaki Kurokawa, Yokohama (JP); Nobuo Kobayashi, Yokohama (JP)

(73) Assignees: Chlorine Engineers Corp., Ltd., Chuo-ku, Tokyo (JP); Toshiba Corp., Ltd., Minato-ku, Tokyo (JP); Shibaura Mechatronics Corp., Ltd., Yokohama-shi, Kanagawa (JP)

( * ) Notice: Subject to any disclaimer, the term of this patent is extended or adjusted under 35 U.S.C. 154(b) by 525 days.

(21) Appl. No.: 12/459,133

(22) Filed: Jun. 26, 2009

(65) Prior Publication Data

US 2009/0325390 A1    Dec. 31, 2009

(30) Foreign Application Priority Data

Jun. 30, 2008    (JP) ................................. 2008-170098

(51) Int. Cl.
    *C25B 1/28*      (2006.01)
(52) U.S. Cl. ........................................ 205/471; 205/554
(58) Field of Classification Search .................. 205/471, 205/554
See application file for complete search history.

(56) References Cited

U.S. PATENT DOCUMENTS

2008/0251108 A1 * 10/2008 Nagai et al. ................. 134/56 R

FOREIGN PATENT DOCUMENTS

| JP | 2006228899 A | * | 8/2006 |
|----|--------------|---|--------|
| JP | 2007103516 A | * | 4/2007 |
| JP | 2008-019507 A | | 1/2008 |
| JP | 2008019507 A | * | 1/2008 |
| JP | 2008-066464 A | | 3/2008 |
| JP | 2008066464 A | * | 3/2008 |
| JP | 2008095144 A | * | 4/2008 |
| JP | 2008111184 A | * | 5/2008 |

* cited by examiner

*Primary Examiner* — Nicholas A. Smith
(74) *Attorney, Agent, or Firm* — Chapman and Cutler LLP

(57) ABSTRACT

The cleaning method by electrolytic sulfuric acid and the manufacturing method of semiconductor device comprising: the process in which the first sulfuric acid solution is supplied from outside to the sulfuric acid electrolytic cell to form the first electrolytic sulfuric acid containing oxidizing agent in the sulfuric acid electrolytic cell; the process in which the second sulfuric acid solution, which is higher in concentration than said the first sulfuric acid solution previously supplied, is supplied from outside to said sulfuric acid electrolytic cell; said the second sulfuric acid solution and the first electrolytic sulfuric acid are mixed in said sulfuric acid electrolytic cell; and electrolysis is performed to form the cleaning solution comprising the second electrolytic sulfuric acid containing sulfuric acid and oxidation agent in said sulfuric acid electrolytic cell and the process in which cleaning treatment is performed for the cleaning object with said cleaning solution.

15 Claims, 7 Drawing Sheets

CLEANING METHOD BY ELECTROLYTIC SULFURIC ACID AND MANUFACTURING METHOD OF SEMICONDUCTOR DEVICE

CROSS-REFERENCE TO RELATED APPLICATIONS

This application is based upon and claims the benefit of priority of Japanese Patent Application 2008-170098, filed on Jun. 30, 2008; the entire contents of which are incorporated herein by reference.

BACKGROUND OF THE INVENTION

1. Field of the Invention

The present invention relates to the cleaning method of photoresist stripping, etc. by electrolytic sulfuric acid containing oxidizing agent formed through electrolysis of sulfuric acid applying the conductive diamond anode, and the manufacturing method of semiconductor device.

2. Description of the Related Art

In the so-called wet cleaning technology, where silicon wafer works are objects of cleaning as seen in the semiconductor device manufacturing, persulfuric acid is used as removing agent for used photoresist, metals and organic pollutants. For such persulfuric acid, electrolytic sulfuric acid containing an oxidizing agent formed by electrolysis of sulfuric acid is used.

Conventionally, as the cleaning method for photoresist stripping, etc. applying electrolytic sulfuric acid containing oxidizing agent formed by electrolysis of sulfuric acid, such method is known that persulfuric acid formed through electrolysis of sulfuric acid is mixed with sulfuric acid at a higher concentration and at a higher temperature than said persulfuric acid, for use of photoresist removal from the substrate. (Patent Document 1)

Patent Document 1 describes that if the treatment solution comprising the mixed solution is raised to 120 degree Celsius or more by the dilution heat generated when sulfuric acid of a higher concentration and a higher temperature is diluted with persulfuric acid, the photoresist stripping effect will be enhanced.

Patent Document 1 also describes that since the sulfuric acid used for production of persulfuric acid by electrolysis is low in concentration as 2-11 mol/L. (20-70% by mass), the electrolysis efficiency to form electrolytic sulfuric acid and production efficiency of persulfuric acid are high, but due to low concentration of sulfuric acid contained in the electrolytic sulfuric acid, the stripping efficiency of photoresist is low and it takes a long time for the photoresist stripping, representing the vital defect as a cleaning process.

The inventors of the present invention have invented, and filed for patent, the sulfuric acid electrolysis process to manufacture persulfuric acid by electrolyzing concentrated sulfuric acid at 90% by mass or more of concentration using a conductive diamond anode, as a technology to supply persulfuric acid with a high cleaning effect, continuously and quantitatively at a high efficiency, and the cleaning process for silicon wafer works applying persulfuric acid manufactured by said process. (Patent Document 2) Compared with platinum electrodes widely used so far as electrodes to form persulfate, this conductive diamond electrode, having a larger oxygen generation overpotential, shows a higher efficiency in electrolytic oxidation of sulfuric acid into persulfuric acid, a higher chemical stability and has a longer electrode life.

The process described in Patent Document 2 electrolyzes concentrated sulfuric acid at a concentration at over 90% by mass, and the electrolytic sulfuric acid containing the oxidizing agent formed from the electrolysis reaction of concentrated sulfuric acid, such as peroxomonosulfuric acid, contains less moisture and therefore, is not decomposed through reaction with moisture, capable of stably forming such oxidizing agent as peroxomonosulfuric acid, achieving a high stripping efficiency for photoresist, etc. Moreover, the higher the concentration of sulfuric acid, the higher the stripping effect it achieves in a short time, resulting in a shorter treating time of the particular step in the semiconductor manufacturing process. The electrolytic sulfuric acid formed by the method of Patent Document 2 contains concentrated sulfuric acid at over 90% by mass and therefore the effect is high.

Electrolytic sulfuric acid means the electrolysis product obtained through electrolysis of sulfuric acid, comprising sulfuric acid added as electrolyte, and substances containing oxidizing agent formed through electrolysis, such as peroxomonosulfuric acid, peroxodisulfuric acid, ozone, and hydrogen peroxide. Incidentally, peroxomonosulfuric acid and peroxodisulfuric acid are collectively called persulfuric acid.

It is known that when such oxidizing agents as peroxomonosulfuric acid, peroxodisulfuric acid, ozone, and hydrogen peroxide are prepared through electrolysis of sulfuric acid, a lower concentration of sulfuric acid supplied to the sulfuric acid electrolytic cell will form oxidizing agents at a higher efficiency, resulting in a higher electrolytic current efficiency. Therefore, as in the method disclosed in Patent Document 2, if a large amount of oxidizing agent is intended to obtain through direct electrolysis of concentrated sulfuric acid as with the case of applying sulfuric acid at a low concentration, additional measures are required, such as prolonged electrolysis time, increased current density, or increased number of sulfuric acid electrolytic cell. This method, however, leads to various problems including poor productivity, scaling up of equipment, increased loading to sulfuric acid electrolytic cells, increased power consumption, and shortened life of hardware.

To improve the stripping property in the cleaning process, sulfuric acid to be supplied to the sulfuric acid electrolytic cell should, preferably, be concentrated sulfuric acid at a high concentration; while, on the other hand, to obtain oxidizing agent effectively by improving electrolytic property, sulfuric acid should, preferably, be at a low concentration. Thus, opposing properties are required for co-existence of the stripping property and the electrolytic property.

[Patent Document 1] Tokkai 2008-66464 Patent Gazette
[Patent Document 2] Tokkai 2008-19507 Patent Gazette

SUMMARY OF THE INVENTION

The present invention intends to provide the cleaning method by electrolytic sulfuric acid and the manufacturing method of semiconductor device which can solve the technological problems of the conventional technologies described in Patent Document 1 and Patent Document 2; to improve the electrolytic current efficiency in forming oxidizing agents including peroxomonosulfuric acid, peroxodisulfuric acid, ozone, and hydrogen peroxide; to produce oxidizing agent stably; and at the same time, to enhance the cleaning and stripping efficiency of photoresist, etc by electrolytic sulfuric acid, enabling both the electrolytic property and the stripping property to coexist satisfactorily.

In order to solve said problems, the present invention provides the cleaning method by electrolytic sulfuric acid characterized by the provision of the following:

as the first step, the first sulfuric acid solution is supplied from outside to the sulfuric acid electrolytic cell in which the anode compartment is separated from the cathode compartment by a diaphragm; the conductive diamond anode is installed in said anode compartment; and the cathode is installed in said cathode compartment, and electrolysis is performed to form the first electrolytic sulfuric acid containing the first sulfuric acid solution and oxidizing agent in said sulfuric acid electrolytic cell;

as the second step, the second sulfuric acid solution, which is higher in concentration than the first sulfuric acid solution previously supplied, is supplied from outside to said sulfuric acid electrolytic cell in which the first electrolytic sulfuric acid containing the first sulfuric acid solution and oxidizing agent and the second sulfuric acid solution are mixed; and electrolysis is performed to form the cleaning solution comprising the first electrolytic sulfuric acid and the second electrolytic sulfuric acid, containing the first sulfuric acid solution, the second sulfuric acid solution and oxidizing agent in said sulfuric acid electrolytic cell; and as the third step, said cleaning solution is supplied to the cleaning tank to perform cleaning treatment for the cleaning object, constituting the cleaning treatment process.

Furthermore, in order to solve said problems, the present invention provides the cleaning method by electrolytic sulfuric acid comprising the processes of the following three steps:

as the first step, the first sulfuric acid solution is supplied from outside to the sulfuric acid electrolytic cell in which the anode compartment is separated from the cathode compartment by a diaphragm; the conductive diamond anode is installed in said anode compartment; and the cathode is installed in said cathode compartment; electrolysis is performed to form the first electrolytic sulfuric acid containing the first sulfuric acid solution and oxidizing agent in said sulfuric acid electrolytic cell; and the first electrolytic sulfuric acid is stored outside said electrolytic cell;

as the second step, the second sulfuric acid solution, which is higher in concentration than the first sulfuric acid solution previously supplied, is supplied from outside to said sulfuric acid electrolytic cell in which electrolysis is performed to form the second electrolytic sulfuric acid containing the second sulfuric acid solution and oxidizing agent in said sulfuric acid electrolytic cell; the second electrolytic sulfuric acid is mixed with said the first electrolytic sulfuric acid stored outside said electrolytic cell to form the cleaning solution; and as the third step, said cleaning solution is supplied to the cleaning tank to perform cleaning treatment for the cleaning object, constituting the cleaning treatment process.

Furthermore, in order to solve said problems, the present invention provides the cleaning method by electrolytic sulfuric acid characterized by the provision of the following:

as the first step, the first sulfuric acid solution is supplied from outside to No. 1 electrolytic cell of multiple numbers of the sulfuric acid electrolytic cell in which the anode compartment is separated from the cathode compartment by a diaphragm; the conductive diamond anode is installed in said anode compartment; and the cathode is installed in said cathode compartment, and electrolysis is performed to form the first electrolytic sulfuric acid containing the first sulfuric acid solution and oxidizing agent in No. 1 electrolytic cell;

as the second step, the second sulfuric acid solution, which is higher in concentration than the first sulfuric acid solution previously supplied, is supplied from outside to No. 2 electrolytic cell of said multiple numbers of the sulfuric acid electrolytic cell; electrolysis is performed to form the second electrolytic sulfuric acid containing the second sulfuric acid solution at a high concentration and sulfuric acid oxidizing agent in No. 2 sulfuric acid electrolytic cell; and the cleaning solution is formed by mixing the first electrolytic sulfuric acid and the second electrolytic sulfuric acid;

as the third step, said cleaning solution is supplied to the cleaning tank to perform cleaning treatment for the cleaning object, constituting the cleaning treatment process.

Furthermore, in order to solve said problems, the present invention provides the manufacturing method of semiconductor device having forming a film to be processed on a semiconductor substrate, processing said film, and removing any of an organic material or metal from said semiconductor substrate using the cleaning method by said electrolytic sulfuric acid.

Furthermore, in order to solve said problems, the present invention provides the manufacturing method of semiconductor device having forming film to be processed on a semiconductor substrate, making a pattern of organic materials on said film, processing said film using the pattern of said organic material as a mask to make a pattern of said film, introducing impurities into said semiconductor substrate, using said pattern of organic material and said pattern of said film as the mask, and removing the pattern of said organic material into which said impurities are introduced, from said semiconductor substrate, applying the cleaning method by said electrolytic sulfuric acid.

An example of overall view of the cleaning method by electrolytic sulfuric acid under the present invention.

FIG. 2

Figure 1:
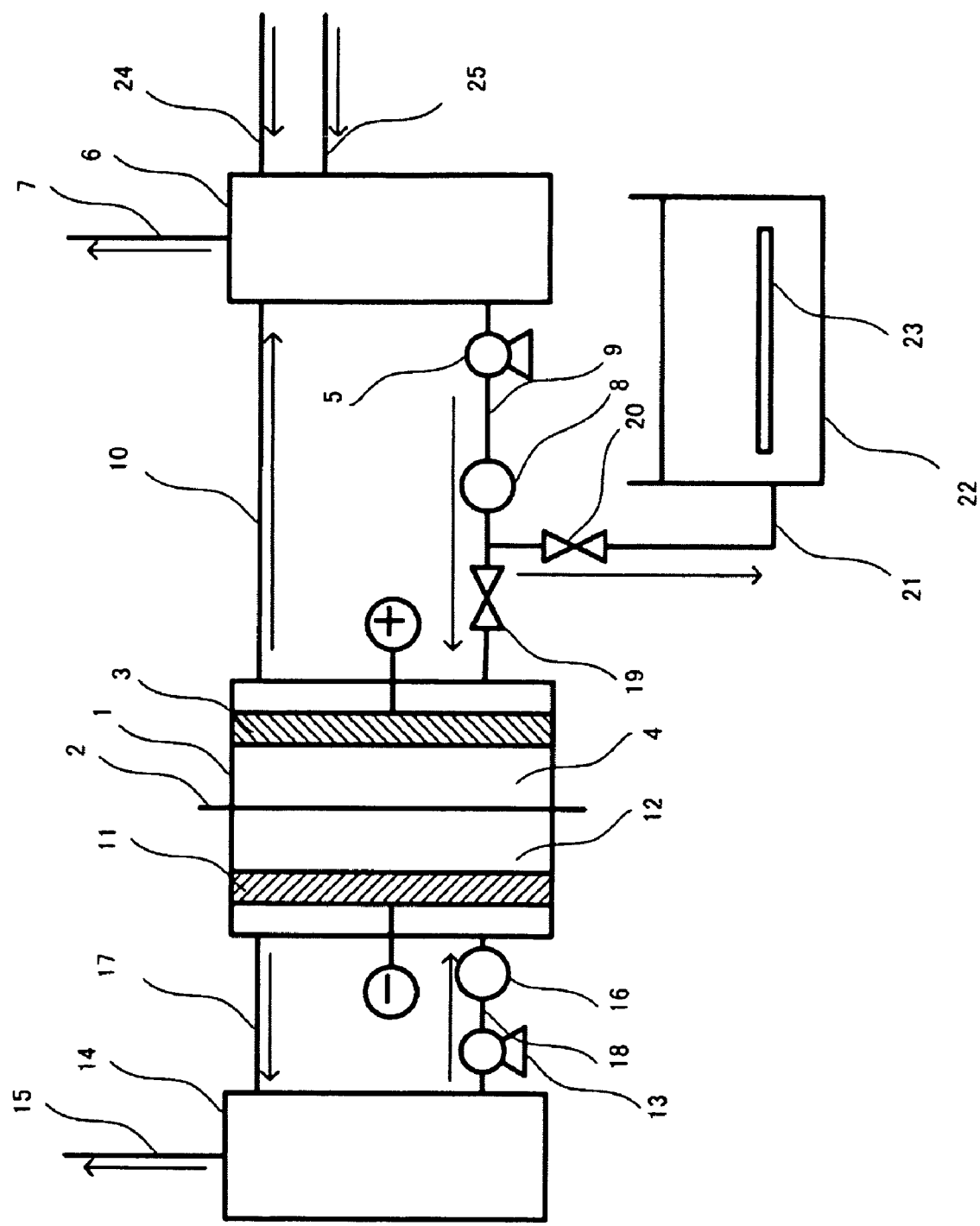
FIG. 1

Process chart of the cleaning method by electrolytic sulfuric acid by the present invention of FIG. 1.

FIG. 3

Another example of overall view of the cleaning method by electrolytic sulfuric acid under the present invention.

FIG. 4

Figure 3:
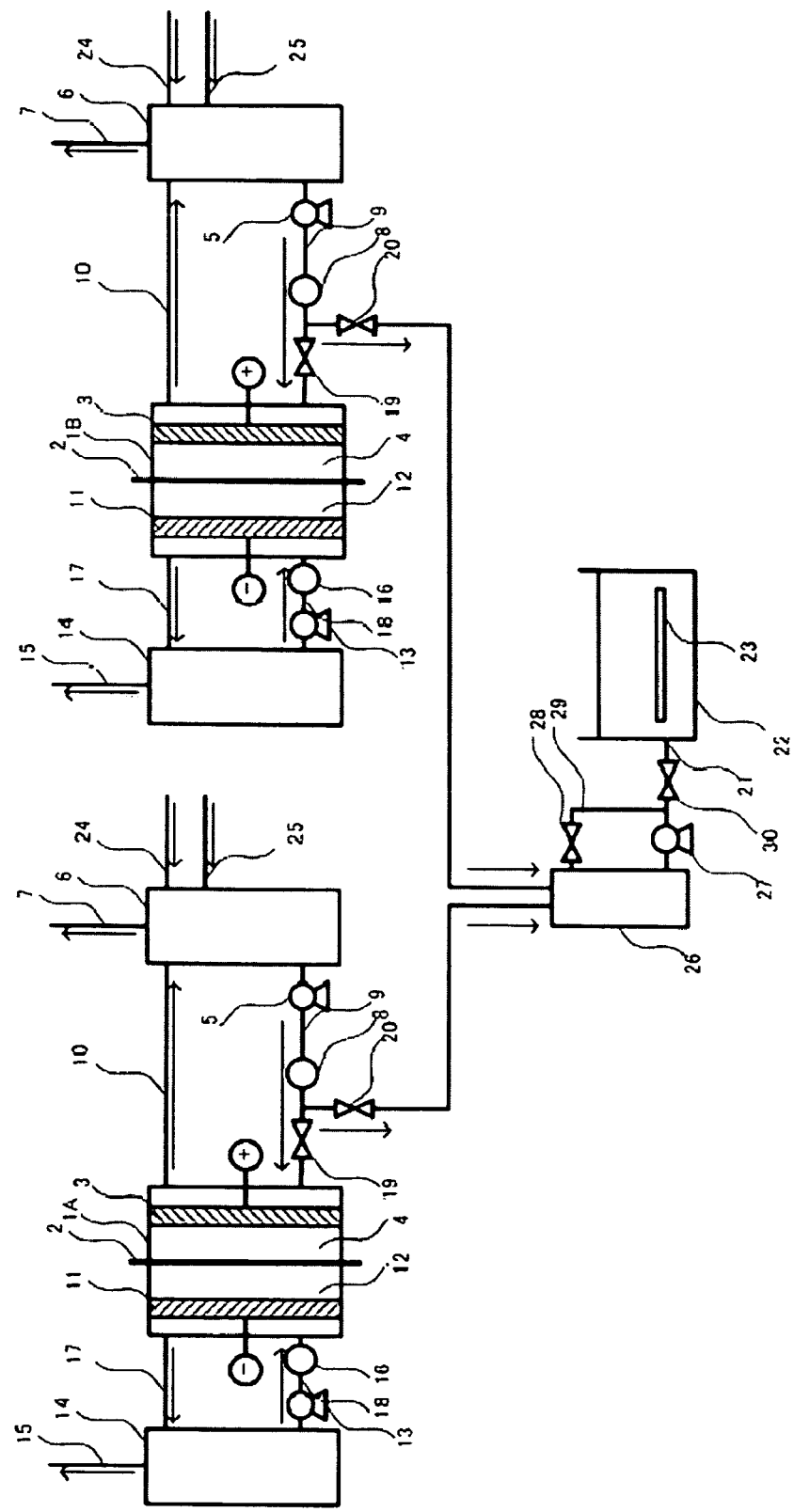

Process chart of the cleaning method by electrolytic sulfuric acid of FIG. 3 by the present invention.

FIG. 5(a)~FIG. 5(d)

Process chart of an example of the manufacturing method of semiconductor device by the present invention; (a) forming photoresist film, (b) patterning, (c) etching and (d) stripping.

Figure 6A:
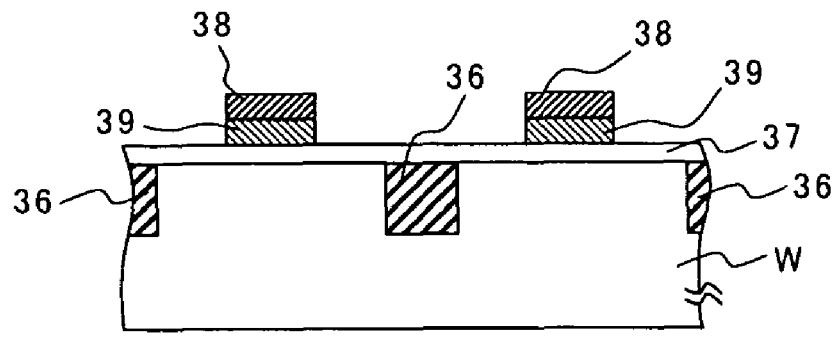
Figure 6B:
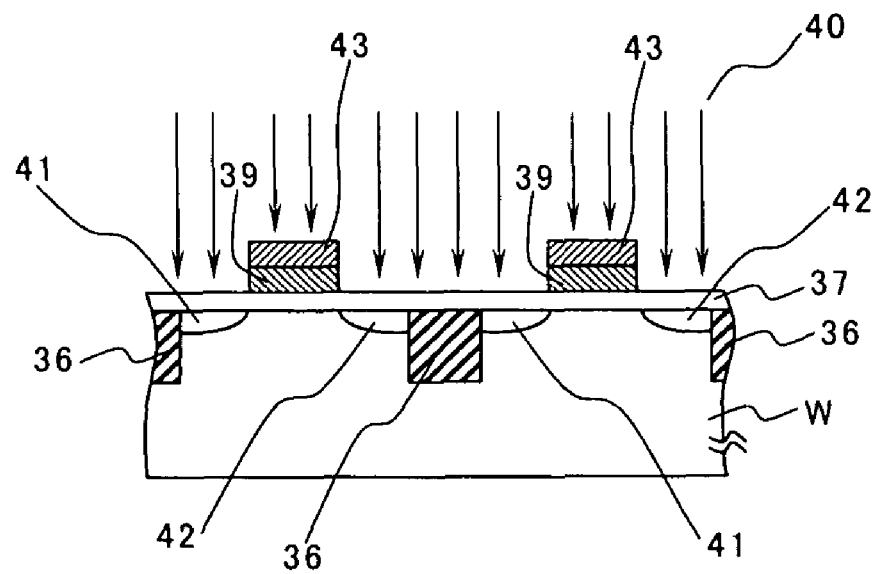
Figure 6C:
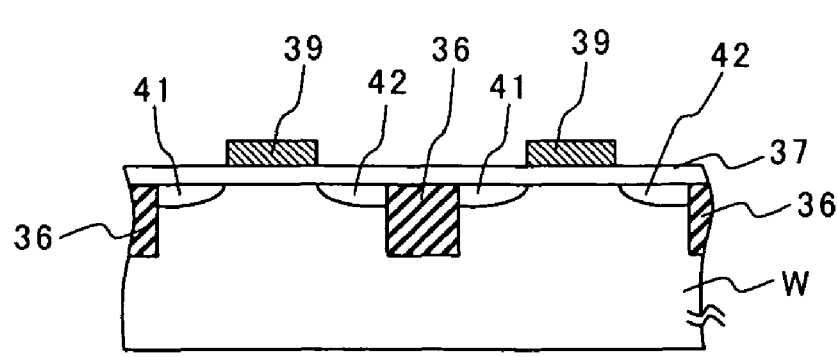

FIG. 6(a)~FIG. 6(c)

Process chart of an example of the manufacturing method of semiconductor device by the present invention; (a) pattern forming, (b) etching and (c) stripping.

Figure 7A:
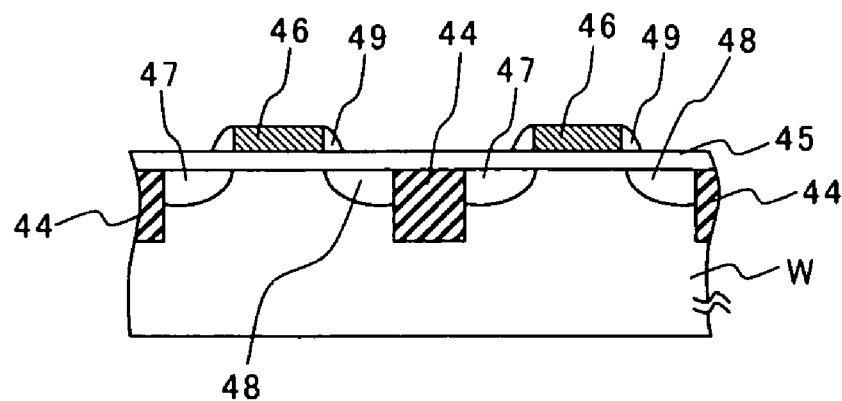
Figure 7B:
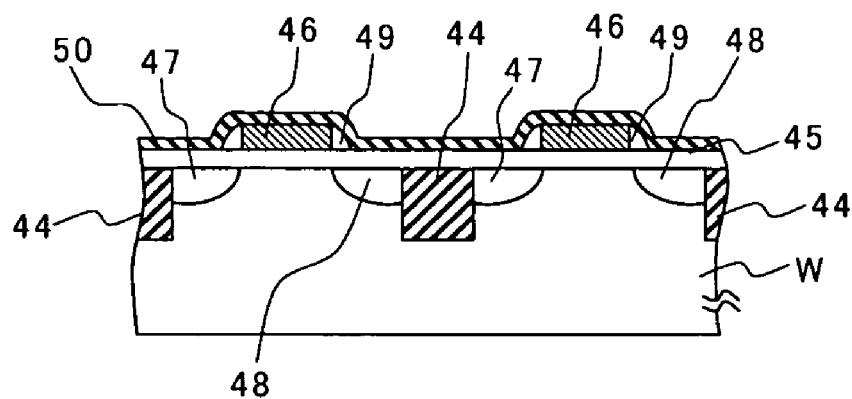
Figure 7C:
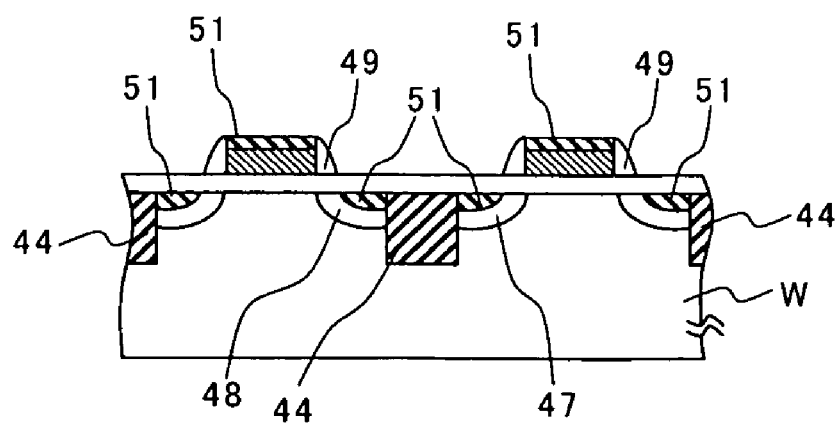

FIG. 7(a)~FIG. 7(c)

Process chart of an example of the manufacturing method of semiconductor device by the present invention; (a) patterning forming, (b) silicide forming and (c) film removal.

DETAILED DESCRIPTION OF THE INVENTION

The following gives an example of the embodiment by the present invention in reference to drawings.

Figure 2:
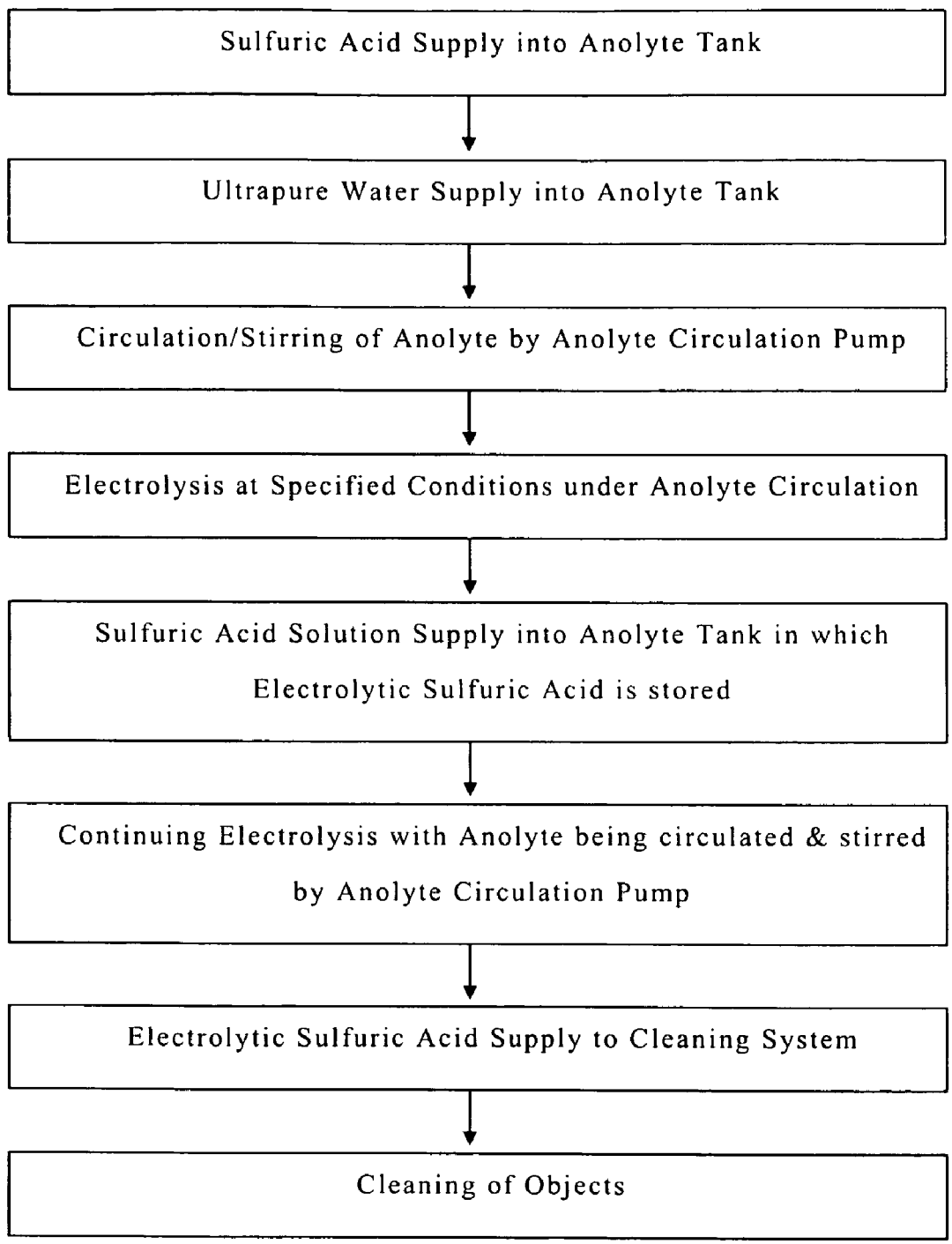

FIG. 1 is an example of the sulfuric acid electrolytic cell 1 and the cleaning method using the sulfuric acid electrolytic cell 1 under the present invention and FIG. 2 is the process chart of the cleaning system of FIG. 1 under the present invention. The sulfuric acid electrolytic cell 1 is divided into the anode compartment 4 and the cathode compartment 12 by the diaphragm 2 and in the anode compartment 4, the conductive diamond anode 3 is installed and in the cathode compartment 12, the cathode 11 is installed. Outside the sulfuric acid electrolytic cell 1, the anolyte tank 6 is equipped. As the first step, as shown in FIG. 1 and FIG. 2, concentrated sulfuric acid at 98% by mass and ultrapure water are supplied to the anolyte tank 6 via the concentrated sulfuric acid feed line 24 and the ultrapure water feed line 25, respectively, and are controlled to the required concentration in the anolyte tank 6 to prepare the first sulfuric acid solution at 70% by mass or less. As shown in the results of examples, when the concentration of the first sulfuric acid solution reaches 70% by mass or less, the electrolytic current efficiency becomes 40% or more, proving efficient electrolysis being made. The first sulfuric acid solution is supplied to the anode compartment 4 of the sulfuric acid electrolytic cell 1 via the anolyte feed line 9 for electrolysis to form the first electrolytic sulfuric acid containing oxidizing agent. To the anode compartment 4, the anolyte circulation line 10 is connected, and the system is configured so that the first electrolytic sulfuric acid containing formed oxidizing agent and anode gas are circulated between the anode compartment 4 and the anolyte tank 6 via the anolyte feed line 9 and the anolyte circulation line 10 by the anolyte circulation pump 5. Therefore, the first electrolytic sulfuric acid containing formed oxidizing agent is sufficiently stirred. The anode gas is subjected to gas-liquid separation in the anolyte tank 6 and vented outside the equipment via the anode gas vent line 7. Sulfuric acid solution at the same concentration with the first sulfuric acid solution supplied to the anode compartment 4 is prepared in the catholyte tank 14, and is supplied to the cathode compartment 12, as the catholyte via the catholyte feed line 18. This catholyte, after electrolysis, is configured to be circulated, together with formed cathode gas, between the cathode compartment 12 and the catholyte tank 14 by the circulation pump 13 via the catholyte feed line 18 and the catholyte circulation line 17. The cathode gas is subjected to gas-liquid separation in the catholyte tank 14 and vented outside the equipment via the cathode gas vent line 15. Other components include the anolyte flow meter & pressure gauge 8 and catholyte flow meter & pressure gauge 16.

Then, as the second step, concentrated sulfuric acid at 98% by mass is fed to the anolyte tank 6 in which the second sulfuric acid solution with a higher concentration than said the first sulfuric acid solution is prepared. The second sulfuric acid solution is preferably controlled to 80% by mass or more in the anolyte tank 6, fed to the anode compartment 4 of the sulfuric acid electrolytic cell 1 via the anolyte feed line 9 and mixed with said the first electrolytic sulfuric acid for electrolysis to form the second electrolytic sulfuric acid containing oxidizing agent. The second electrolytic sulfuric acid containing formed oxidizing agent and anode gas are configured to be circulated between the anode compartment 4 and the anolyte tank 6 by the anolyte circulation pump 5 via the anolyte feed line 9 and anolyte circulation line 10. Therefore, the second electrolytic sulfuric acid containing formed oxidizing agent is sufficiently stirred. On the side of the catholyte tank 14 also, the same configuration is arranged to prepare sulfuric acid, though no description is given. The photoresist stripping performance with the electrolytic sulfuric acid is satisfactory with the sulfuric acid concentration at 80% by mass or more, but if the concentration of sulfuric acid is lower than it, the stripping performance is not high, leading to prolonged time for photoresist stripping, even though the concentration of oxidizing agent is high.

The second electrolytic sulfuric acid containing formed oxidizing agent, thus prepared in said way, has been sufficiently stirred, achieving a uniform cleaning solution. As the third step, this cleaning solution is supplied to the cleaning tank 22 via the anode compartment valve 19, chemical feed valve 20, and chemical feed line 21 to perform cleaning the cleaning object 23.

Meanwhile, the concentration of sulfuric acid solution to be supplied to said cathode compartment 12 is desirably the same concentration with the first sulfuric acid solution to be supplied to the anode compartment 4. Otherwise, catholyte and anolyte tend to mix through diffusion of mass transfer via a diaphragm, resulting in decreased concentration of oxidizing agent in the anolyte, difficulty in controlling temperature of the electrolytic cell and electrolyte being hindered by appreciable generation of dilution heat, leading to difficulty in forming oxidizing agent stably with time.

As another mode of the cleaning method by the present invention, such arrangement is possible that the first electrolytic sulfuric acid containing the first sulfuric acid solution and formed oxidizing agent in the first step are stored in the tanks (not shown in Figures) provided outside the electrolytic cell 1; and the second electrolytic sulfuric acid containing the second sulfuric acid solution and formed oxidizing agent in the second step is also sent to said tanks, where the first electrolytic sulfuric acid and the second electrolytic sulfuric acid are mixed to prepare the cleaning solution. Mixing of the first electrolytic sulfuric acid and the second electrolytic sulfuric acid can be made within the piping on the way, without providing said tanks.

Moreover, in the present invention, multiple numbers of sulfuric acid electrolytic cells can be applied in place of a single sulfuric acid electrolytic cell. FIG. 3 shows an additional embodiment of the cleaning method by electrolytic sulfuric acid under the present invention and FIG. 4 shows the process chart of the cleaning method by electrolytic sulfuric acid of FIG. 3 by the present invention.

Figure 4:
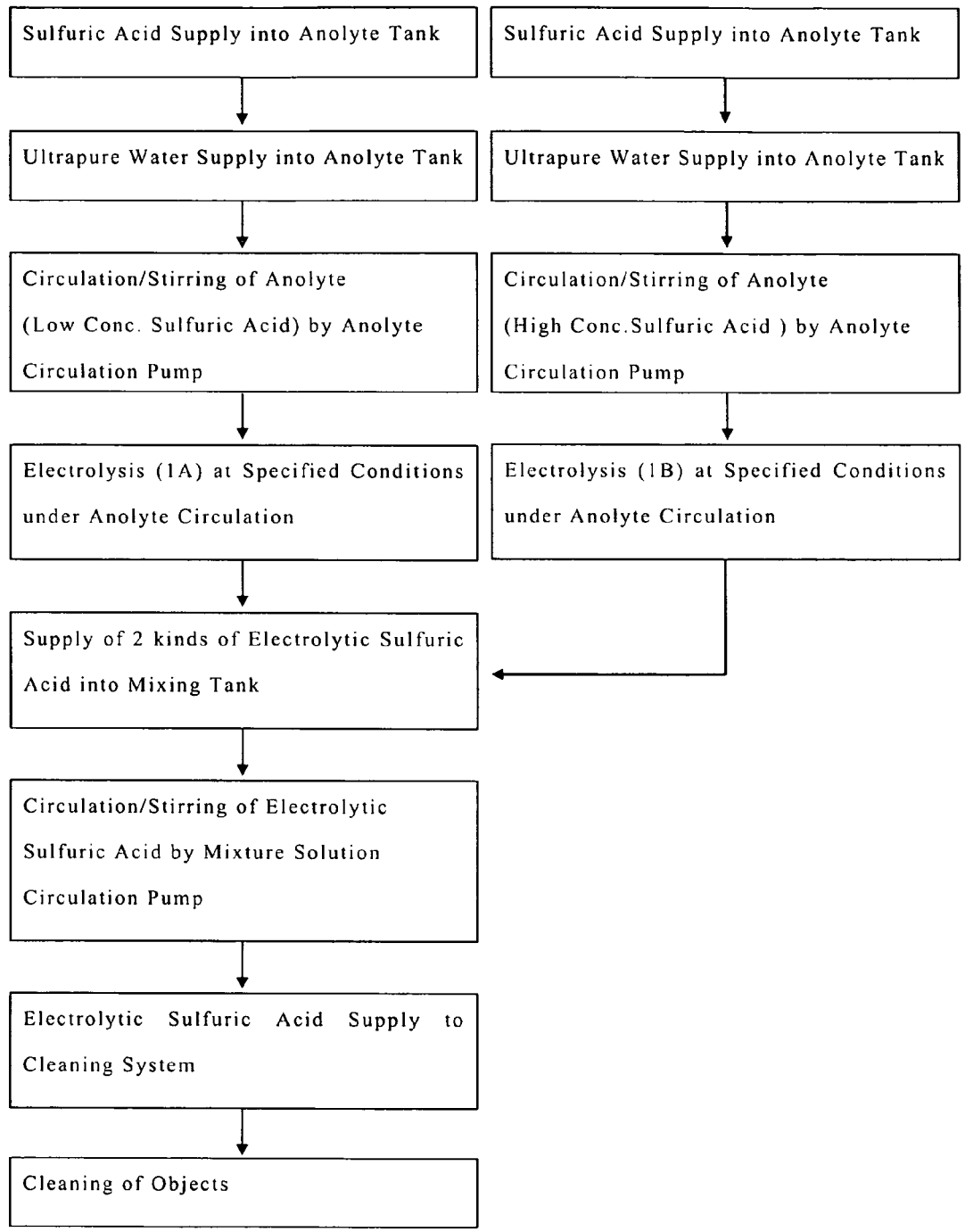

As shown in FIG. 3 and FIG. 4, as the first step, the first sulfuric acid solution is supplied from outside to the sulfuric acid electrolytic cell 1A (1) among the multiple numbers of sulfuric acid electrolytic cells in which the anode compartment 4 is separated from the cathode compartment 12 by the diaphragm 2; the conductive diamond anode 3 is installed in said anode compartment 4; and the cathode 11 is installed in said cathode compartment 12; and electrolysis is performed to form the first electrolytic sulfuric acid containing oxidizing agent; and as the second step, the second sulfuric acid solution, which is higher in concentration than said the first sulfuric acid solution previously supplied, is supplied from outside to the sulfuric acid electrolytic cell 1B (2) among said multiple numbers of the sulfuric acid electrolytic cell; electrolysis is performed to form the second electrolytic sulfuric acid containing oxidizing agent in said sulfuric acid electrolytic cell 1B (2); and the electrolytic sulfuric acid (3) is formed by mixing said the first electrolytic sulfuric acid and said the second electrolytic sulfuric acid in the mixing tank 26; and as the third step, said electrolytic sulfuric acid (3), as cleaning solution, is circulated by the mixed liquid circulation pump 27, the mixed liquid circulation valve 28, the mixed liquid circulation line 29 and via the mixed liquid feed valve 30 and the chemical feed valve 21, cleaning treatment is performed for the cleaning object 23 in the cleaning tank 22.

For the production of persulfuric acid, use of a conductive diamond electrode, as anode is advantageous because of its large oxygen generation overpotential and a high chemical stability. If the application is intended for semiconductor manufacturing, such as for resist stripping by the electrolyte, the conductive diamond electrode is preferable for its less formation of metal impurities from the electrode. As a cathode, any material is applicable as far as it has properties of electric conductivity and sulfuric acid corrosion resistance, such as a conductive diamond electrode, platinum plate and carbon plate.

In the present invention, the conductive diamond anode 3 is used as anode and concentrated sulfuric acid is electrolyzed by this conductive diamond anode 3. The conductive diamond anode 3 has a higher oxygen overpotential compared with platinum electrode or lead dioxide electrode (platinum: several hundreds mV; lead dioxide: approx. 0.5V; conductive diamond: approx. 1.4V), and water is oxidized, and oxygen or ozone is generated, as shown in the reaction equations (1) and (2). Moreover, if sulfuric acid ions or hydrogen sulfate ions exist in the anolyte, these ions are oxidized and persulfuric acid ion is generated, as shown in the reaction equations (3) and (4).

$$2H_2O \rightarrow O_2 + 4H^+ + 4e^- (1.23\ V) \quad (1)$$

$$3H_2O \rightarrow O_3 + 6H^+ + 6e^- (1.51\ V) \quad (2)$$

$$2SO_4^{2-} \rightarrow S_2O_8^{2-} + 2e^- (2.01\ V) \quad (3)$$

$$2HSO_4^- \rightarrow S_2O_8^{2-} + 2H^+ + 2e^- (2.12\ V) \quad (4)$$

As afore-mentioned, these reactions of oxygen generation reaction by water electrolysis and formation of persulfuric acid ion by oxidation of sulfuric acid ion are competing reactions, but if the conductive diamond anode 3 is applied, the formation of persulfuric acid ion precedes.

This is attributed to the facts that the conductive diamond anode 3 has an extremely broad potential window; the over potential to oxygen generation reaction is high; and the targeted oxidation reaction stays within the potentially progressive range, and therefore, if electrolysis of the aqueous solution containing sulfuric acid ion is performed, persulfuric acid forms at a high current efficiency, while oxygen generation is only little to occur.

The reason why the oxygen overpotential is high with the conductive diamond anode 3 can be explained as follows. On an ordinary electrode surface, water is first oxidized to form oxygen chemical species and from this oxygen chemical species, oxygen or ozone is considered to be formed. On the other hand, diamond is chemically more stable than ordinary electrode material, and uncharged water is hard to adsorb to the surface and therefore, oxidation of water is considered little to occur. By contrast, sulfuric acid ion, which is anion, is easy to adsorb to the surface of diamond, functioning an anode, even at a low potential, and presumably the forming reaction of persulfate ion is more to occur than oxygen generation reaction.

The conductive diamond anode 3 applied under the present invention is manufactured by supporting the conductive diamond film, which is reduction deposit of organic compounds, as carbon source, on the conductive substrate. The material and shape of said substrate are not specifically limited as far as the material is conductive and can be either in plate, mesh, or porous plate, for instance, of bibili fiber sintered body, comprising conductive silicon, silicon carbide, titanium, niobium and molybdenum, and as material, use of conductive silicon or silicon carbide with similar thermal expansion rate is preferable. Moreover, in order to enhance adherence between the conductive diamond film and the substrate, and also to increase surface area of the conductive diamond film to lower current density per unit area, the surface of the substrate should preferably be rough to a certain extent.

When the conductive diamond film is used in membrane, the thickness of membrane should preferably be 10 μm-50 μm to increase durability and to reduce pin-hole development. A self-supported membrane more than 100 μm thick is applicable, but cell voltage becomes too high, rendering the temperature control of electrolyte to be more complicated.

The method to support the conductive diamond film to the substrate has no specific limitation and is optional from among conventional methods. Typical manufacturing methods of the conductive diamond film include the hot filament CVD (chemical deposition), microwave plasma CVD, plasma arcjet, and physical vapor deposition method (PVD), with the microwave plasma CVD being desirable in view of a higher film-making rate and uniform film preparation.

Among other applicable is the conductive diamond anode 3 with the conductive diamond film bonded using resin, etc. on the substrate applying synthetic diamond powder manufactured by using ultra-high pressure. In particular, if hydrophobic ingredient, such as fluororesin, is present on the electrode surface, sulfuric acid ion, which is the object of treatment, is easily trapped, leading to enhanced reaction efficiency. The microwave plasma CVD method is the process in which the hydrogen-diluted mixture gas of carbon source like methane and dopant source like diborane is introduced to the reaction chamber, connected with a microwave transmitter via a waveguide, in which film forming substrate of the conductive diamond anode 3, such as conductive silicon, alumina and silicon carbide is installed, so that plasma is generated within the reaction chamber to develop conductive diamond on the substrate. Ions by microwave plasma do not oscillate, and chemical reaction is effected at a pseudo-high temperature condition where only electrons are made oscillated. Output of plasma is 1-5 kW, the larger the output, the more the active species can be generated and the rate of diamond growth accelerated. Advantage of using plasma lies in the fact that diamond filming is possible at a high speed on a large surface area substrate.

For providing conductivity to the conductive diamond anode 3, a trace amount of elements having different atomic values is added. The content of boron or phosphorus is preferably 1-100000 ppm, or more preferably 100-10000 ppm. As the raw materials for this additive element, boron oxide or phosphorus pentoxide, which is less toxic, is applicable. The conductive diamond anode 3, thus manufactured and supported on the substrate, can be connected to the current collector comprising conductive substances, such as titanium, niobium, tantalum, silicon, carbon, nickel and tungsten carbide, in a configuration of flat plate, punched plate, metal mesh, powder-sintered body, metal fiber, metal fiber-sintered body, etc.

The sulfuric acid electrolytic cell 1, 1A and 1B are configured to be a 2-chamber type electrolytic cell, separated into the anode compartment 4 and the cathode compartment 12 by the diaphragm 2 of a reinforced ion exchange membrane or of a porous resin membrane subjected to hydrophilic treatment, so that persulfuric acid ions formed at the conductive diamond anode 3 will not be reduced to sulfuric acid ions through the contact with the cathode 11.

The material of the cell frame of the sulfuric acid electrolytic cell 1, 1A and 1B should preferably be high-temperature-tolerant and high-chemical resistant PTFE or New PFA in view of durability. As the sealing material, porous PTFE, or rubber sheets or O-rings coated with PTFE or New PFA, such as Gore-Tex or Poreflon. Also, for enhancing sealing effect, the cell frame should preferably be v-notched or be given projection processing.

As the diaphragm 2, the neutral membranes, such as trade name—Poreflon, or cation exchange membranes, such as trade names—Nafion, Aciplex, and Flemion are applicable; however, in view of the fact that the product in each compartment can be manufactured separately, use of cation exchange membranes, the latter, is preferable, with an additional advantage that cation exchange membrane can promote electrolysis even when the conductivity of electrolyte is low, such as ultrapure water. To minimize the effect from concentration gradient of water and to decrease the cell voltage, desirable cation exchange membranes include those with packing (reinforcing cloth) with dimensional stability even at a low moisture content; those of 50 μm or less in thickness; and those of no laminated layers of ion exchange membranes. In the coexistence with a substance of low equilibrium vapor pressure, like sulfuric acid at 96% by mass, ion exchange membrane shows a low moisture content and an increased specific resistance value leading to a problem of increased electrolysis cell voltage. When highly-concentrated sulfuric acid like 96% by mass is supplied to the anode compartment 4 to obtain persulfuric acid at a high efficiency, it is desirable to supply sulfuric acid at 70% by mass or below to the cathode compartment 12 in order to supply water to ion exchange membrane.

In the present invention, resin membranes subjected to hydrophilic treatment with IPA (isopropyl alcohol) is applicable as the diaphragm 2, other than ion exchange membranes. Porous fluororesin membranes, other than ion exchange membranes, marketed under the trade names Gore-Tex or Poreflon do not perform electrolysis without hydrophilic treatment, such as with IPA treatment. Said porous fluororesin membranes are hydrophobic and neither permeation of sulfuric acid solution nor proceeding of electrolysis is possible. If this porous fluororesin membrane undergoes hydrophilic treatment, said resin membrane turns to be capable of containing water or concentrated sulfuric acid and electric conduction by sulfuric acid becomes possible, enabling to function as electrolytic cell diaphragm. Porous fluororesin membranes without this treatment keep air in the holes, being unable to conduct electricity, and electrolysis does not proceed. In case that resin membranes subjected to hydrophilic treatment are used as diaphragm, diaphragm itself shows no resistance and electrolysis is performed at a low electrolytic cell voltage, although formed products in both compartments slightly mingle, compared with the case in which ion exchange membranes are used as diaphragm.

Porous alumina plates commonly used as a diaphragm in the production of persulfate are also applicable with enough durability in the electrolytic cell disclosed in the present specifications; however, impurities from porous alumina plates mingle in the electrolyte, and therefore, this type of diaphragm cannot be used for the production of semiconductor cleaning liquid.

This diaphragm 2 can be sandwiched between two sheets of protection board, made of PTFE or new PFA on which holes are punched or in the form of expanded mesh.

The conductive diamond anode 3 has a large oxidative power and organic substance in contact with anodically polarized conductive diamond surface is decomposed to convert to mostly carbon dioxide. The diaphragm 2 in the sulfuric acid electrolytic cell 1 vibrates between the anode and the cathode under the output pressure of the liquid supply pump used for liquid supply to the sulfuric acid electrolytic cell 1 and therefore, if said protection board is not provided, the diaphragm 2 may possibly consume in contact with the conductive diamond anode 3 or the cathode 11. Also, if vibration occurs while the protection board is not provided, the clearance between the electrode and the diaphragm varies and cell voltage may fluctuate.

In the following, the present invention is explained in reference to examples and comparison examples; provided, however, the present invention is not limited to these examples.

EXAMPLE 1~9

The following explains an example of the operation method of the sulfuric acid electrolytic cell 1 by the present invention. As the sulfuric acid electrolytic cell 1, the sulfuric acid electrolytic cell shown in FIG. 1 was used. For the conductive diamond anode 3 and the cathode 11, the conductive diamond electrode, with conductive diamond coated on the surface of 3 mm thick, 6 inch dia. silicon plate, was applied. As the diaphragm 2, porous PTFE diaphragm was applied. The electrolysis area was about 1 dm$^2$. Electrolysis conditions include: current density: 50 A/dm$^2$, electrolysis time: 15 minutes and electrolyte: sulfuric acid.

As the first step, concentrated sulfuric acid at 98% by mass and ultrapure water were supplied, via the concentrated sulfuric acid feed line 24 and the ultrapure water feed line 25, to the anolyte tank 6 in which the concentration of sulfuric acid was adjusted to form the first sulfuric acid solution and stored there. The concentration of sulfuric acid solution was controlled to 70% by mass in Examples 1-3, to 50% by mass Examples 4-6, and to 30% by mass in Examples 7-9. Then, the first sulfuric acid solution stored in the anolyte tank 6 was pumped to the anode compartment 4 by the anode circulation pump 5. The first sulfuric acid solution was electrolyzed in the anode compartment 4. Obtained the first electrolytic sulfuric acid containing oxidizing agent is circulated together with formed anode gas by the anode circulation pump 5, through the anolyte feed line 9, the anode compartment 4, the anolyte circulation line 10, and to the anolyte tank 6, being sufficiently stirred and electrolysis continued. Anode gas was vented outside the system after gas-liquid separation in the anolyte tank 6. On the side of the catholyte tank 14 also, the same configuration was arranged for concentration adjustment, circulation and stirring.

Table 1 shows electrolysis conditions, mixing conditions, concentration of all oxidizing agent after electrolysis, concentration of all oxidizing agent after mixing, electrolytic current efficiency and stripping test result, in the first step. As shown in Table 1, in the first step, the first sulfuric acid solution, relatively low in concentration at 70% by mass, 50% by mass, 30% by mass was electrolyzed and the electrolytic current efficiency as high as at 41-75% and the first electrolytic sulfuric acid with the concentration of all formed oxidizing agent as high as 0.22-0.44 mol/L. were obtained. Meanwhile, the concentration of all oxidizing agent is the concentration obtained in such a manner that electrolytic sulfuric acid or sulfuric acid is diluted with water, followed by the potassium iodide titration, and the concentration of the material which can oxidize potassium iodide into iodine is converted for the concentration of peroxodisulfuric acid presumed as formed by electrolytic oxidation. Peroxomonosulfuric acid, peroxodisulfuric acid, ozone and hydrogen peroxide have the property to oxidize potassium iodide and the total oxidizing amount including these is given in Table 1.

TABLE 1

| | electrolytic conditions | | | | all oxidizing agents conc. | | | stripping | |
|---|---|---|---|---|---|---|---|---|---|
| | current density (A/dm²) | electrolytic time (min.) | sulfuric acid conc. (wt. %) | anolyte temp. at electrolysis start up (° C.) | sulfuric acid conc. (wt. %) after mixing | all oxidizing agents conc. (mol./L) soon after electrolysis | all oxidizing agents conc. (mol./L) soon after mixing | current efficiency (%) | electrolyte temp. (° C.) | stripping time (sec.) |
| Example1 | 50 | 15 | 70 | 40 | 80 | 0.22 | 0.15 | 41 | 100 | 20 |
| Example2 | 50 | 15 | 70 | 40 | 85 | 0.22 | 0.11 | 41 | 100 | 20 |
| Example3 | 50 | 15 | 70 | 40 | 90 | 0.22 | 0.07 | 41 | 100 | 30 |
| Example4 | 50 | 15 | 50 | 40 | 80 | 0.35 | 0.16 | 59 | 100 | 20 |
| Example5 | 50 | 15 | 50 | 40 | 85 | 0.35 | 0.12 | 59 | 100 | 25 |
| Example6 | 50 | 15 | 50 | 40 | 90 | 0.35 | 0.08 | 59 | 100 | 30 |
| Example7 | 50 | 15 | 30 | 40 | 80 | 0.44 | 0.16 | 75 | 100 | 20 |
| Example8 | 50 | 15 | 30 | 40 | 85 | 0.44 | 0.12 | 75 | 100 | 25 |
| Example9 | 50 | 15 | 30 | 40 | 90 | 0.44 | 0.08 | 75 | 100 | 30 |

As the second step, the concentrated sulfuric acid at 98% by mass and ultrapure water were supplied, via the concentrated sulfuric acid feed line 24 and the ultrapure water feed line 25, to the anolyte tank 6 in which the concentration of sulfuric acid was adjusted to form the second sulfuric acid solution and stored there. Then, the second sulfuric acid solution stored in the anolyte tank 6 was pumped to the anode compartment 4 by the anode circulation pump 5. In the anode compartment 4, the second sulfuric acid solution was mixed with the first electrolytic sulfuric acid prepared in the first step and electrolyzed in the anode compartment 4 to form the second electrolytic sulfuric acid.

The concentration of sulfuric acid, after the concentration adjustment made in the anolyte tank 6 was 80-90% by mass as given in Table 1.

The concentration of oxidizing agent of the second electrolytic sulfuric acid thus obtained in the second step was kept high as 0.07-0.16 mol/L., as shown in Table 1.

The second electrolytic sulfuric acid in the second step was circulated, together with formed anode gas, by the anode circulation pump 5 via the anolyte feed line 9, the anode compartment 4, the anolyte circulation line 10 and anolyte tank 6 with sufficient stirring and uniform cleaning solution was obtained through continuous electrolysis operation.

As the third step, the cleaning solution was supplied to the cleaning tank 22 via the anode compartment valve 19, the chemical feed valve 20 and the chemical feed line 21, where the cleaning object 23 was cleaned. This cleaning solution contains a high concentration of oxidizing agent as well a high concentration of sulfuric acid, and therefore, the stripping time for cleaning objects 23 was short as 20-30 sec.

COMPARATIVE EXAMPLE 1~7

In Comparative Examples 1-7, electrolysis operation conducted was only that of the first step in Examples 1-9, neither performing mixing operation with the second sulfuric acid solution at a high concentration in the anode compartment nor further electrolysis. The results are as given in Table 2, showing that in Comparative Examples 1, 2, 6, the concentration of oxidizing agent were within the range of 0.09-0.10 mol./L., being almost equivalent amount.

However, in spite that the concentration of oxidizing agent was almost equivalent amount, the stripping time of Comparative Example 1 with the electrolytic sulfuric acid at 70% by mass was 315 sec.; in contrast with e Comparative Example 2 with 80% by mass being 40 sec., and Comparative Example 6 with 90% by mass being 30 sec. In other words, if the amount of the oxidizing agent is equivalent, the higher the concentration of sulfuric acid, the higher the photoresist stripping efficiency.

TABLE 2

| | electrolytic conditions | | | | all oxidizing agents conc. | | | stripping | |
|---|---|---|---|---|---|---|---|---|---|
| | current density (A/dm²) | electrolytic time (min.) | sulfuric acid conc. (wt. %) | anolyte temp. at electrolysis start up (° C.) | sulfuric acid conc. (wt. %) after mixing | all oxidizing agents conc. (mol./L) soon after electrolysis | all oxidizing agents conc. (mol./L) soon after mixing | current efficiency (%) | electrolyte temp. (° C.) | stripping time (sec.) |
| Comparative Example 1 | 50 | 7 | 70 | 40 | | 0.11 | | 41 | 100 | 315 |
| Comparative Example 2 | 50 | 11 | 80 | 40 | | 0.09 | | 13 | 100 | 40 |
| Comparative Example 3 | 50 | 15 | 70 | 40 | | 0.22 | | 41 | 100 | 105 |
| Comparative Example 4 | 50 | 15 | 80 | 40 | | 0.13 | | 25 | 100 | 30 |
| Comparative Example 5 | 50 | 15 | 85 | 40 | | 0.12 | | 23 | 100 | 30 |

TABLE 2-continued

|  | electrolytic conditions | | | | all oxidizing agents conc. | | | stripping | |
|---|---|---|---|---|---|---|---|---|---|
|  | current | | | | all oxidizing agents conc. (mol./L) | all oxidizing agents conc. (mol./L) | | | |
|  | density (A/dm²) | electrolytic time (min.) | sulfuric acid conc. (wt. %) | anolyte temp. at electrolysis start up (° C.) | sulfuric acid conc. (wt. %) after mixing | after electrolysis | soon after mixing | current efficiency (%) | electrolyte temp. (° C.) | stripping time (sec.) |
| Comparative Example 6 | 50 | 15 | 90 | 40 | | 0.1 | | 19 | 100 | 30 |
| Comparative Example 7 | 50 | 15 | 95 | 40 | | 0.07 | | 13 | 100 | 30 |

In Comparative Examples 1 and 3, the concentration of sulfuric acid is both 70% by mass, but the amount of oxidizing agent was, Comparative Example 1 at 0.010 mol/L and Comparative Example 3 at 0.18 mol/L. and the stripping times were 315 sec. and 105 sec., respectively. It has been found that if the concentration of sulfuric acid is the same, the photoresist stripping efficiency is higher at a higher concentration of oxidizing agent.

In Comparative Examples 3-7, the electrolysis operation was conducted at the same electricity per the amount of solution. The result indicated that a higher concentration of oxidizing agent was obtained from a lower concentration of sulfuric acid. Namely, a higher current efficiency of oxidizing agent is obtained with a lower concentration of sulfuric acid.

From said Examples and Comparative Examples, such problem has been proven to exist in the manufacturing process of electrolytic sulfuric acid with photoresist stripping effect through electrolysis of sulfuric acid that with respect to the concentration of oxidizing agent effective on photoresist stripping, the lower the concentration of sulfuric acid, the higher the electrolytic current efficiency and the higher the concentration, but contrarily, the higher the concentration of sulfuric acid, the higher the photoresist stripping efficiency.

According to the present invention, the cleaning method by the electrolytic sulfuric acid relating to the present invention can be applied in the manufacturing process of semiconductor device. Namely, said cleaning method can be applied when specified processes are performed to prepare semiconductor devices, respective patterns of wiring, electrodes, etc. are formed on the substrate and used photoresist, metals, or organic pollutants are removed from the substrate.

The following explains the manufacturing method of semiconductor device, as an example of the embodiments, in reference to FIG. 5(a)-FIG. 5(d).

First, a silicon wafer W was prepared, as a semiconductor substrate, to form a semiconductor device. On this silicon wafer W, patterns of each component, such as wiring, electrodes, etc. constituting a semiconductor device can be formed by publicly known technologies, such as lithography and dry etching, to meet the application purposes.

Figure 5A:
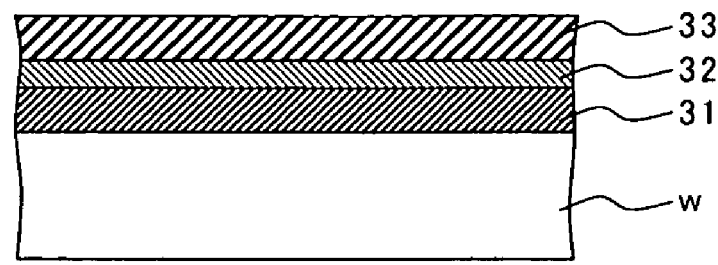

More in detail, as shown in FIG. 5(a), the insulation film 31 such as silicon oxide film and the conductive film 32 comprising silicon materials, being wiring or electrode (eg. gate electrode) materials were laminated sequentially on the silicon wafer W. Then, the photoresist film 33 was applied on the conductive film 32, and exposure light at a specified wave length was irradiated to the photoresist film 33 via the photo mask on which patters were drawn.

Figure 5B:
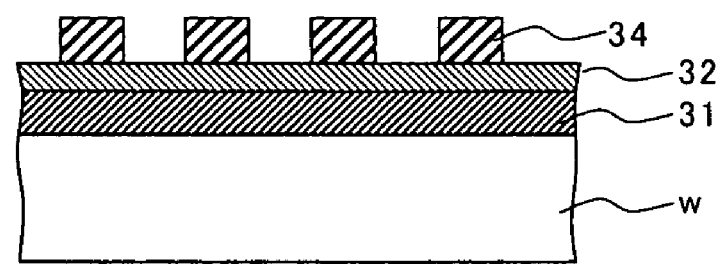
Figure 5C:
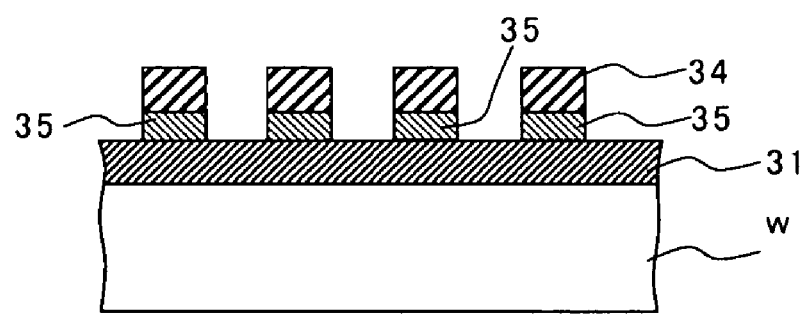

Following the processing procedures of the irradiated photoresist film 33, the desired photoresist pattern 34 is formed on the conductive film 32, or photoresist film, as shown in FIG. 5(b). Successively, etching processing was applied to the conductive film 32 or photoresist film using the photoresist pattern 34 as a mask, so that the desired conductive pattern 35 was formed, as shown in FIG. 5(c). In this particular case, as an example, the reactive ion etching process was applied, as dry etching technology, where the desired conducive pattern 35 is formed on the silicon wafer W via the insulating film 31.

Figure 5D:
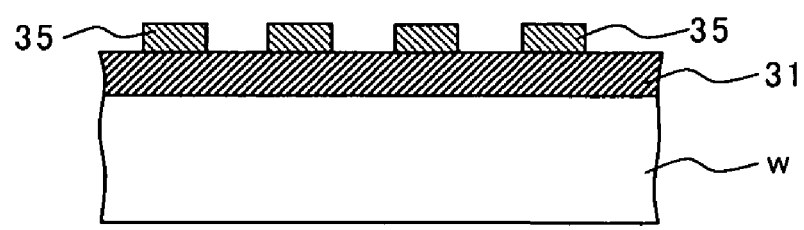

As shown in FIG. 5(d), the photoresist pattern 34, used as a mask at the etching process, is removed by a specified treatment liquid from the conductive pattern 35.

In the present mode of embodiment, the silicon wafer W on which the photoresist pattern 34 and the conductive pattern 35 had been formed was treated altogether with the specified cleaning treatment liquid, in the course of manufacturing semiconductor device. In the concrete, the treatment is performed by the treatment liquid with the cleaning solution containing the oxidizing agent obtained through electrolysis of the concentrated sulfuric acid in said sequence and procedures.

After the ashing treatment under the specified conditions, the photoresist pattern 34 can also be removed from the conductive pattern 35 by the treatment with the treatment solution containing the cleaning solution with said oxidizing agent, as shown in FIG. 5(d). Said ashing treatment herein referred to, can be performed by using at least any one of gases including oxygen plasma gas, nitrogen plasma gas, and mixing gas of oxygen plasma gas and nitrogen plasma gas, under the specified conditions.

Also, as shown in FIG. 1 and FIG. 3, the photoresist pattern 34 is removed by immersing the whole silicon wafer W, as the cleaning object, in the cleaning tank 22 for a specified time period. Using the cleaning solution containing oxidizing agent obtained through electrolysis of concentrated sulfuric acid in said sequence and procedures, the photoresist pattern 34 is stripped and removed from the silicon wafer W in the cleaning tank 22 in order to achieve the treatment condition of the silicon wafer as shown in FIG. 5(d).

The treatment of silicon wafer W can be performed either in the way of so-called "single wafer" treatment or a batch treatment.

In addition, the present invention is applicable in the following embodiment, relating to the photoresist removal.

Namely, the present invention can be used in such a case that in the manufacture of the semiconductor device, photoresist is used as a mask, and after the step of introducing specific impurities, such as specified conductive type ions, into the lower silicone area, the photoresist, being the mask, to which the impurities have been introduced, is removed.

The following explains said case in detail referring to FIG. 6(a)-FIG. 6(c). First, the silicon wafer W is prepared as a semiconductor substrate, on which the element separation region 36 and the gate insulation film 37 are formed sequentially; then as shown in FIG. 6(a), the gate electrode pattern 39 comprising polycrystalline silicon is formed by, for instance, the reactive ion etching process using the photoresist pattern 38 as a mask.

Then, using the photoresist pattern 38 and the gate electrode pattern 39 made of polycrystalline silicon as the mask, the desired conductive impurities 40 (specified conductive type ion) are introduced by the ion implantation method, etc., to make the source region 41 and the drain region 42 on the lower silicon layer, which, in this case, is the silicon wafer W). At this time, the photoresist pattern 38 used as the mask is in the state of having been altered, that is, the surface has been hardened, as a result of impurities introduction by said ion implantation, etc. (hereafter called the photoresist pattern 43)

In the later process of removing photoresist used as the mask, the treatment solution containing the cleaning solution with oxidizing agent obtained through the electrolysis of concentrated sulfuric acid in sad sequences and procedures is used. Namely, applying said cleaning method by the electrolytic sulfuric acid according to the present invention, the photoresist pattern 43 in the state of being altered as aforementioned or photoresist residual materials are removed from the silicon wafer W, the cleaning object, by stripping, etc., as shown in FIG. 6(c).

The photoresist used as the mask on this stage is in the state that the impurities (specified conductive type ion) have been introduced by the ion implantation method, etc. and the surface has been hardened and therefore the removal of it is difficult, but by the embodiment of the present invention, the removal of them can be easily and efficiently performed.

After the ashing treatment under the specified conditions, the photoresist pattern 43 in the state of being altered as afore-mentioned can also be removed from the gate electrode pattern 39 by the treatment with the treatment solution containing the cleaning solution with said oxidizing agent, as shown in FIG. 6(c). Said ashing treatment herein referred to, can be performed by using at least any one of gases including oxygen plasma gas, nitrogen plasma gas, and mixing gas of oxygen plasma gas and nitrogen plasma gas, under the specified conditions.

Moreover, the present invention can be applied in the embodiment as follows. In the manufacturing method of semiconductor devices, silicide film is formed for the gate electrode comprising silicon materials, the source region, the drain region, etc.

Detailed explanation is given as below in reference to FIG. 7(a)-FIG. 7(c). First, on the silicon wafer W prepared as the semiconductor substrate, the element separation region 44 and the gate insulation film 45 are formed sequentially; then as shown in FIG. 7(a), the gate electrode pattern 46 comprising polycrystalline silicon, the source region 47 of a specified conductive type and the drain region 48 are formed. In this process, the side wall film 49 is formed on the both sides of gate electrode pattern 46. Using publicly known film forming technologies, such as the sputtering process, the metal film 50 by specified metals like Ni, Co, etc. is laminated on the gate electrode pattern 46, the source region 47 and the drain region 48; then, as they stand, annealing treatment is applied at a specified temperature to make each silicon layer of the gate electrode pattern 46, the source region 47 and the drain region 48 react with the metal film 50, as shown in FIG. 7(b) so as to form the silicide region 51 on each silicon layer.

Then, in the step to remove the metal film 50, the treatment solution containing the cleaning solution with oxidizing agent obtained through the electrolysis of concentrated sulfuric acid in said sequences and procedures, is used.

Namely, applying the cleaning method by the electrolytic sulfuric acid according to the present invention, the metal film 50 is removed from the silicon wafer W, the cleaning object, as shown in FIG. 7(c).

According to the present embodiments, the stripping effect of photoresist can be enhanced, enabling to improve precision and efficiency in the manufacture of semiconductor device.

According to the cleaning method by electrolytic sulfuric acid and manufacturing method of semiconductor device by the present invention, the electrolytic current efficiency for the formation of electrolytic sulfuric acid can be improved and at the same time, oxidizing agent like peroxomonosulfuric acid can be formed stably; the cleaning & stripping efficiency can be improved; two opposing properties of the electrolytic property and the stripping property can be made coexisted; oxidizing agent are formed at a high efficiency; oxidizing power of them can be utilized as cleaning power, achieving photoresist stripping in a short period of time; and therefore the present invention can be utilized in cleaning areas for various objects.

FIGURE LEGEND

1: sulfuric acid electrolytic cell
1A: No. 1 sulfuric acid electrolytic cell
1B: No. 2 sulfuric acid electrolytic cell
2: diaphragm
3: conductive diamond anode
4: anode compartment
5: anolyte circulation pump
6: anolyte tank
7: anode gas vent line
8: anolyte flow meter & pressure gauge
9: anolyte feed line
10: anolyte circulation line
11: cathode
12: cathode compartment
13: circulation pump
14: catholyte tank
15: cathode gas vent line
16: catholyte flow meter & pressure gauge
17: catholyte circulation line
18: catholyte feed line
19: anode compartment valve
20: chemical feed valve
21: chemical feed line
22: cleaning tank
23: cleaning object
24: concentrated sulfuric acid feed line
25: ultrapure water feed line
26: mixing tank
27: mixed liquid circulation pump
28: mixed liquid circulation valve
29: mixed liquid circulation line
30: mixed liquid feed valve
31: insulation film
32: conductive film
33: photoresist film
34: photoresist pattern
35: conductive pattern
36: element separation region
37: gate insulation film
38: photoresist pattern 39: gate electrode pattern
40: conductive impurities (specified conductive type ion)
41: source region
42: drain region
43: photoresist pattern
44: element separation region
45: gate insulation film
46: gate electrode pattern
47: source region
48: drain region
49: side wall film
50: metal film
51: silicide region
W: silicon wafer

The invention claimed is:

1. A cleaning method by electrolytic sulfuric acid, comprising: as a first step, supplying a first sulfuric acid solution from outside into a sulfuric acid electrolytic cell having an anode compartment separated from a cathode compartment by a diaphragm, a conductive diamond anode installed in said anode compartment, and a cathode installed in said cathode compartment; and performing electrolysis to form a first electrolytic sulfuric acid containing said first sulfuric acid solution and oxidizing agent in said sulfuric acid electrolytic cell; as a second step, supplying a second sulfuric acid solution that has a higher sulfuric acid concentration than said first sulfuric acid solution from outside into said sulfuric acid electrolytic cell, wherein said first electrolytic sulfuric acid containing said first sulfuric acid solution and oxidizing agent, and said second sulfuric acid solution, are mixed; and performing electrolysis to form a cleaning solution comprising said first electrolytic sulfuric acid and a second electrolytic sulfuric acid, containing the first sulfuric acid solution, the second sulfuric acid solution, and oxidizing agent, in said sulfuric acid electrolytic cell; and as a third step, supplying said cleaning solution to a cleaning tank to perform cleaning treatment of an object to be cleaned.

2. The cleaning method by electrolytic sulfuric acid as defined in claim 1, wherein electrolysis is continuously performed while said first electrolytic sulfuric acid and said second electrolytic sulfuric acid are circulated, with stirring, between said sulfuric acid electrolytic cell and an anolyte tank provided outside said sulfuric acid electrolytic cell.

3. A manufacturing method of a semiconductor device, comprising:
    forming a film to be processed on a semiconductor substrate:
    processing said film; and
    removing any of an organic material or a metal from said semiconductor substrate using the cleaning method as defined in claim 2.

4. A manufacturing method of a semiconductor device, comprising:
    forming a film to be processed on a semiconductor substrate;
    making a pattern of organic material on said film;
    processing said film using said pattern of organic material as a mask to make a pattern of said film;
    introducing impurities into said semiconductor substrate, using said pattern of organic material and said pattern of said film as a mask; and
    removing said pattern of organic material into which said impurities are introduced, from said semiconductor substrate, using the cleaning method as defined in claim 2.

5. The cleaning method by electrolytic sulfuric acid as defined in claim 1, wherein a concentration of said first electrolytic sulfuric acid is controlled to be 70% by mass or less, and a concentration of said second sulfuric acid is controlled to be 80% by mass or more.

6. A manufacturing method of a semiconductor device, comprising:
    forming a film to be processed on a semiconductor substrate;
    processing said film; and
    removing any of an organic material or a metal from said semiconductor substrate using the cleaning method as defined in claim 5.

7. A manufacturing method of a semiconductor device, comprising:
    forming a film to be processed on a semiconductor substrate;
    making a pattern of organic material on said film;
    processing said film using said pattern of organic material as a mask to make a pattern of said film;
    introducing impurities into said semiconductor substrate, using said pattern of organic material and said pattern of said film as a mask; and
    removing said pattern of organic material into which said impurities are introduced, from said semiconductor substrate, using the cleaning method as defined in claim 5.

8. A manufacturing method of a semiconductor device, comprising:
    forming a film to be processed on a semiconductor substrate;
    processing said film; and
    removing any of an organic material or a metal from said semiconductor substrate using the cleaning method as defined in claim 1.

9. A manufacturing method of a semiconductor device, comprising:
    forming a film to be processed on a semiconductor substrate;
    making a pattern of organic material on said film;
    processing said film using said pattern of organic material as a mask to make a pattern of said film;
    introducing impurities into said semiconductor substrate, using said pattern of organic material and said pattern of said film as a mask; and
    removing said pattern of organic material into which said impurities are introduced, from said semiconductor substrate, using the cleaning method as defined in claim 1.

10. A cleaning method by electrolytic sulfuric acid, comprising:
    as a first step,
        supplying a first sulfuric acid solution from outside into a sulfuric acid electrolytic cell having an anode compartment separated from a cathode compartment by a diaphragm, a conductive diamond anode installed in said anode compartment, and a cathode installed in said cathode compartment;
        performing electrolysis to form a first electrolytic sulfuric acid containing said first sulfuric acid solution and oxidizing agent in said sulfuric acid electrolytic cell; and
        storing said first electrolytic sulfuric acid outside said electrolytic cell;
    as a second step,
        supplying a second sulfuric acid solution that has a higher sulfuric acid concentration than said first sulfuric acid solution from outside into said sulfuric acid electrolytic cell;

performing electrolysis to form a second electrolytic sulfuric acid containing said second sulfuric acid solution and oxidizing agent in said sulfuric acid electrolytic cell; and mixing said second electrolytic sulfuric acid with said first electrolytic sulfuric acid stored outside said electrolytic cell to form a cleaning solution; and as a third step, supplying said cleaning solution to a cleaning tank to perform cleaning treatment of an object to be cleaned.

11. A manufacturing method of a semiconductor device, comprising:

forming a film to be processed on a semiconductor substrate;

processing said film; and removing any of an organic material or a metal from said semiconductor substrate using the cleaning method as defined in claim 10.

12. A manufacturing method of a semiconductor device, comprising:

forming a film to be processed on a semiconductor substrate;

making a pattern of organic material on said film;

processing said film using said pattern of organic material as a mask to make a pattern of said film;

introducing impurities into said semiconductor substrate, using said pattern of organic material and said pattern of said film as a mask; and removing said pattern of organic material into which said impurities are introduced, from said semiconductor substrate, using the cleaning method as defined in claim 10.

13. A cleaning method by electrolytic sulfuric acid, comprising:

as a first step, supplying a first sulfuric acid solution from outside into a first one of a plurality of sulfuric acid electrolytic cells, each of said sulfuric acid electrolytic cells having an anode compartment separated from a cathode compartment by a diaphragm, a conductive diamond anode installed in said anode compartment, and a cathode installed in said cathode compartment; and performing electrolysis to form a first electrolytic sulfuric acid containing said first sulfuric acid solution and oxidizing agent in said first sulfuric acid electrolytic cell;

as a second step, supplying a second sulfuric acid Solution having a higher sulfuric acid concentration than said first sulfuric acid solution from outside into a second one of said sulfuric acid electrolytic cells;

performing electrolysis to form a second electrolytic sulfuric acid containing said second sulfuric acid solution and sulfuric acid oxidizing agent in said second sulfuric acid electrolytic cell; and mixing said first electrolytic sulfuric acid and said second electrolytic sulfuric acid to form a cleaning solution; and as a third step, supplying said cleaning solution to a cleaning tank to perform cleaning treatment of an object to be cleaned.

14. A manufacturing method of a semiconductor device, comprising:

forming a film to be processed on a semiconductor substrate;

processing said film; and removing any of an organic material or a metal from said semiconductor substrate using the cleaning method as defined in claim 13.

15. A manufacturing method of a semiconductor device, comprising:

forming a film to be processed on a semiconductor substrate;

making a pattern of organic material on said film;

processing said film using said pattern of organic material as a mask to make a pattern of said film;

introducing impurities into said semiconductor substrate, using said pattern of organic material and said pattern of said film as a mask; and removing said pattern of organic material into which said impurities are introduced, from said semiconductor substrate, using the cleaning method as defined in claim 13.

* * * * *